United States Patent
Atrash et al.

(10) Patent No.: US 7,345,529 B2
(45) Date of Patent: Mar. 18, 2008

(54) CHOPPER STABILIZED AMPLIFIER WITHOUT DC OUTPUT RIPPLE

(75) Inventors: Amer H. Atrash, Dallas, TX (US); Brett J. Thompsen, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 138 days.

(21) Appl. No.: 11/147,521

(22) Filed: Jun. 8, 2005

(65) Prior Publication Data
US 2006/0279353 A1 Dec. 14, 2006

(51) Int. Cl.
*H03F 1/02* (2006.01)

(52) U.S. Cl. .......................... 330/9; 330/288

(58) Field of Classification Search ................ 330/9, 330/51, 257, 288
See application file for complete search history.

(56) References Cited

U.S. PATENT DOCUMENTS

| | | | |
|---|---|---|---|
| 6,175,278 B1 * | 1/2001 | Hasegawa | 330/288 |
| 6,980,054 B2 * | 12/2005 | Okada | 330/257 |
| 7,088,180 B2 * | 8/2006 | Lee et al. | 330/257 |

* cited by examiner

*Primary Examiner*—Khanh Van Nguyen
(74) *Attorney, Agent, or Firm*—Alan K. Stewart; W. James Brady; Frederick J. Telecky, Jr.

(57) ABSTRACT

The chopper stabilized amplifier circuit includes: an amplifier; a first current mirror coupled to an output of the amplifier through a first switch; a second current mirror coupled to the output of the amplifier through a second switch, wherein the first switch is operated out of phase with the second switch; and a summing node for combining currents from the first and second current mirrors.

4 Claims, 1 Drawing Sheet

CHOPPER STABILIZED AMPLIFIER WITHOUT DC OUTPUT RIPPLE

FIELD OF THE INVENTION

The present invention relates to electronic circuitry and, in particular, to a chopper stabilized amplifier without DC output ripple.

BACKGROUND OF THE INVENTION

A typical prior art chopper stabilized amplifier functions by switching between two states. The output voltage at each state is averaged using a low-pass filter (a simple R-C filter). The output of the filter is continuously adjusting towards the filter input and will have a ripple whenever the two amplifier states are different (as is typically the case). In a regular prior art implementation, chopper stabilized amplifiers have a ripple at the amplifier output, even when the amplifier is in a DC state.

The prior art circuit shown in FIG. 1 illustrates the typical approach to chopper stabilization. The circuit of FIG. 1 includes NMOS transistors Mn1 and Mn2; PMOS transistors Mp1, Mp2, and Mp3; differential amplifier AMP; capacitor Cfil; resistors Rfil and R1; current Isense; current source I1; and output Vsense. The amplifier in the circuit has two operating states, as in all chopper designs. Each state has a distinct output voltage at node N1 resulting from non-idealities in the amplifier and will produce a distinct current in transistor MP3. Typically the amplifier output voltages at node N1 will be within a few millivolts of each other and the currents in transistor MP3 will be very similar. In this case, the primary non-ideality of interest is offset between the input devices. In general, the objective of chopper stabilization here is to take the two distinct states (one which represents the inherent offset and the other which will be the opposite but equal magnitude offset) and average them together. The average of the two states should be the ideal output voltage (as if the amplifier had zero offset). Therefore, in a state with a DC input, the amplifier output will be stepping between two voltages and the filtered voltage (at the gate of transistor MP1) is intended to be the average of the two amplifier output voltages at node N1 and will have a ripple resulting from the steps.

SUMMARY OF THE INVENTION

A chopper stabilized amplifier circuit includes: an amplifier; a first current mirror coupled to an output of the amplifier through a first switch; a second current mirror coupled to the output of the amplifier through a second switch, wherein the first switch is operated out of phase with the second switch; and a summing node for combining currents from the first and second current mirrors.

DETAILED DESCRIPTION OF PREFERRED EMBODIMENTS

Figure 2:
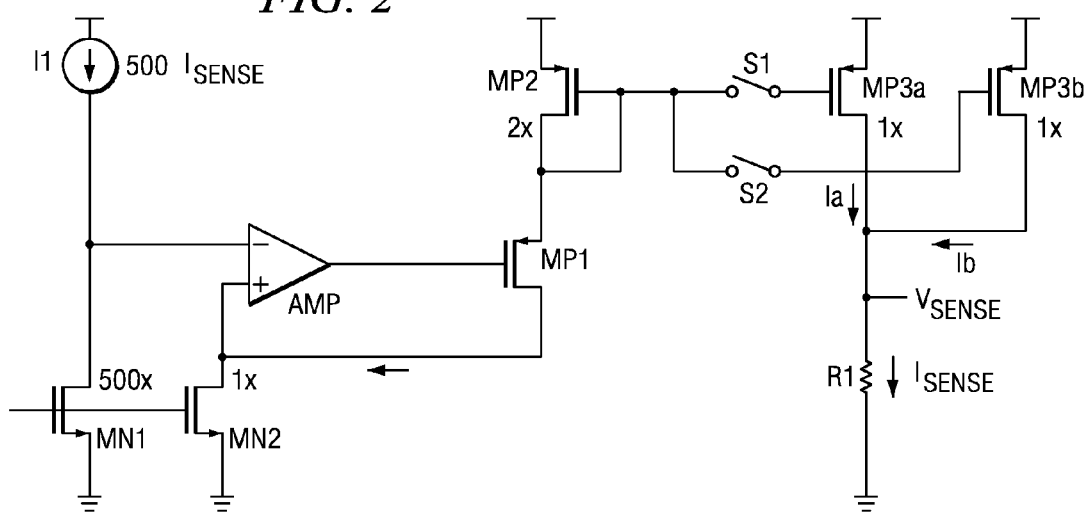
FIG. 2 is a circuit diagram of a chopper stabilized amplifier without DC output ripple, according to the present invention.

The present invention, shown in FIG. 2, eliminates the ripple that ordinarily exists in a chopper stabilized amplifier at DC. The circuit of FIG. 2 includes NMOS transistors Mn1 and Mn2; PMOS transistors Mp1, Mp2, Mp3$a$ and Mp3$b$; differential amplifier AMP; resistor R1; switches S1 and S2; current Isense; current source I1; and output Vsense.

Ordinarily, the amount of ripple can be reduced (but not eliminated) by using an RC filter with a larger time constant (i.e., using a large resistor and a larger capacitor). An RC filter with a large time constant consumes a large die area (large resistors and large capacitors both require substantial die area). The large resistor and capacitor introduce a new limit to the transient response of the amplifier and will typically be the dominant transient limitation. The present invention requires only two switches S1 and S2 which can be minimum sized transistors and require very little die area.

Figure 1:
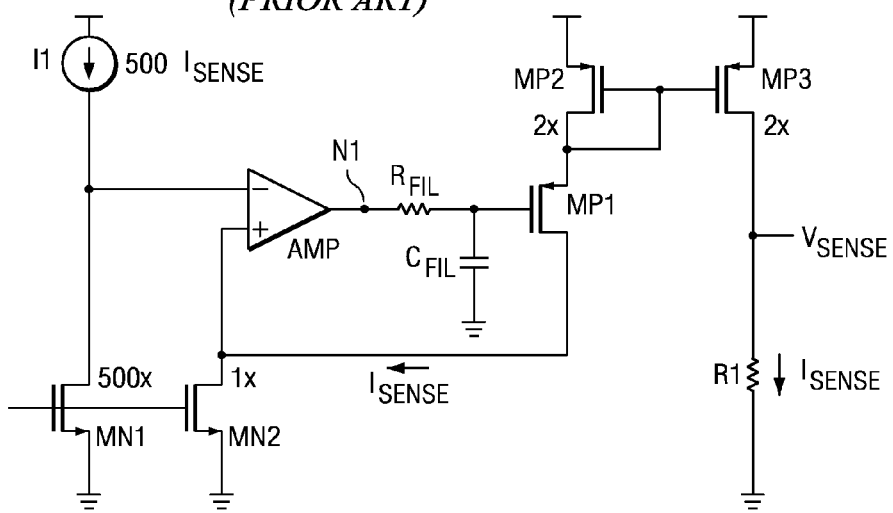
FIG. 1 is a circuit diagram of a prior art chopper stabilized amplifier.

The present invention seeks to eliminate this ripple. In the present invention shown in FIG. 2, the averaging of the two circuit states is achieved by adding two currents instead of using an RC filter to average voltage. Transistor Mp3 from the prior art circuit of FIG. 1 has been split into two devices (transistors Mp3$a$ and Mp3$b$) that are each half the aspect ratio of the prior art device. For each operating state of the amplifier, one of the transistors Mp3$a$ or Mp3$b$ will be connected to transistor Mp2 and will provide the appropriate amount of current for its state. On the other phase, the gate of transistor Mp3$a$ or Mp3$b$ will be disconnected from transistor Mp2, but will hold its voltage and the device will continue to provide the current appropriate to its state. Therefore, in a state with a DC input, each transistor Mp3$a$ and Mp3$b$ will provide a constant current that is different from each other but that will not change with time. In this manner, the output ripple has been eliminated.

The output averaging is achieved by summing the two currents Ia and Ib. Using two current mirrors (a first current mirror formed by transistors Mp2 and Mp3$a$, and a second current mirror formed by transistors Mp2 and Mp3$b$), each with a ratio of 2:1, and adding the mirrored currents Ia and Ib, gives an effective averaging of the states of the amplifier. Since each current mirror is programmed with a current corresponding to a particular state of the amplifier, the current value for each mirror will be constant, resulting in a constant sum and no ripple at DC.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A chopper stabilized amplifier circuit comprising:
   an amplifier;
   a first current mirror coupled to an output of the amplifier through a first switch;
   a second current mirror coupled to the output of the amplifier through a second switch, wherein the first switch is operated out of phase with the second switch;
   a summing node for combining currents from the first and second current mirrors;
   wherein the first current mirror comprises:
      a first transistor coupled to the output of the amplifier; and
      a second transistor having a control node coupled to the control node of the first transistor and to the output of the amplifier, wherein the first switch is coupled between the control node of the first transistor and the control node of the second transistor.

2. The circuit of claim 1 wherein the second current mirror comprises: a third transistor having a control node coupled to the control node of the first transistor and to the output of the amplifier, wherein the second switch is coupled between the control node of the first transistor and the control node of the third transistor.

3. A chopper stabilized amplifier circuit comprising:
an amplifier for providing an output current;
a first current mirror coupled to the amplifier through a first switch for mirroring the output current to a first branch;
a second current mirror coupled to the amplifier through a second switch for mirroring the output current to a second branch, wherein the first switch is operated out of phase with the second switch;
a summing node for combining currents from the first and second branches;
wherein the first current mirror comprises:
  a first transistor coupled to an output current node of the amplifier; and
  a second transistor having a control node coupled to the control node of the first transistor and to the output current node of the amplifier, wherein the first switch is coupled between the control node of the first transistor and the control node of the second transistor.

4. The circuit of claim 3 wherein the second current mirror comprises: a third transistor having a control node coupled to the control node of the first transistor and to the output current node, wherein the second switch is coupled between the control node of the first transistor and the control node of the third transistor.

* * * * *